United States Patent

Matsumura et al.

Patent Number: 5,186,801
Date of Patent: Feb. 16, 1993

[54] PRODUCTION OF COLOR FILTER

[75] Inventors: Akira Matsumura, Hirakata; Masashi Ohata, Osaka; Katsukiyo Ishikawa, Kuze, all of Japan

[73] Assignee: Nippon Paint Co., Ltd., Osaka, Japan

[21] Appl. No.: 749,294

[22] Filed: Aug. 23, 1991

[30] Foreign Application Priority Data

Aug. 23, 1990 [JP] Japan .................. 2-223026

[51] Int. Cl.$^5$ .................................... C25D 13/04
[52] U.S. Cl. ........................ 204/181.1; 204/181.6; 204/181.7; 430/7; 430/293; 430/394
[58] Field of Search ........... 204/181.1, 181.7, 180.6; 430/20, 293, 394, 7

[56] References Cited

U.S. PATENT DOCUMENTS

| | | | |
|---|---|---|---|
| 4,808,501 | 2/1989 | Chiulli | 430/7 |
| 4,902,592 | 2/1990 | Matsumura et al. | 204/18.1 |
| 5,008,166 | 4/1991 | Aoki | 430/20 |

FOREIGN PATENT DOCUMENTS

| | | |
|---|---|---|
| 0255557 | 2/1988 | European Pat. Off. |
| 210901 | 9/1988 | Japan |
| 2081462 | 2/1982 | United Kingdom |

Primary Examiner—John Niebling
Assistant Examiner—Kishor Mayekar
Attorney, Agent, or Firm—Wenderoth, Lind & Ponack

[57] ABSTRACT

The present invention provides an improved process for forming a color filter for a color display. The process comprises:

(a) forming a transparent electroconductive layer on a substrate,
(b) forming a negative type photosensitive resin layer having a desired color by electrodeposition on the transparent electroconductive layer,
(c) exposing the photosensitive resin layer to light through a negative mask having a desired pattern followed by developing to form a patterned color layer, and
(d) effecting the steps (b) and (c) necessary times to form patterned layers having required colors.

5 Claims, 1 Drawing Sheet

R ··· Red
G ··· Green
B ··· Blue

PRODUCTION OF COLOR FILTER

FIELD OF THE INVENTION

The present invention relates to a process for preparing a color filter which colors a display element (e.g. a liquid crystal display element).

BACKGROUND OF THE INVENTION

There have been proposed various methods for forming a color filter for a display element. Among them, a method using electrodeposition has become noteworthy.

For example, Japanese Kokai Publication 61-272720 discloses a method wherein a positive type photosensitive resin layer is formed on an electroconductive layer which is formed on a substrate, and then is exposed and developed, followed by forming color layers by electrodeposition. This method utilizes such properties that the positive type photosensitive layer is changed to be soluble with a developer only at the portion which has been exposed to light, and the non-exposed portion remains photosensitive. After developing the exposed portion, a color layer is formed on a bared electroconductive layer by electrodeposition. Then, the non-exposed portion of the positive type photosensitive layer is exposed to light and the same operations are effected. This process is ideally possible from an ideal standpoint, but in actuality is almost impossible. The positive type photosensitive resin composition which is commercially available generally contains quinonediazide and is chemically modified once contacted with a developer. The modified photosensitive resin composition loses its photosensitivity and can not be exposed and developed any more. Therefore, in actuality, the photosensitive resin layer once contacted with the developer is removed and then a new positive type photosensitive resin composition is newly applied thereto. These removal and application processes make the process complicated.

Japanese Kokai Publication 1-152449 discloses that a color negative type photosensitive resin composition is spin-coated on a substrate and then exposed and developed to form a patterned color layer, and the same process is conducted with a negative type photosensitive resin composition having another color. In this method, spin-coating is essential but is difficult to apply to a substrate having a large area. Also, since the color negative type photosensitive resin composition is spin-coated on an already formed different color layer, a difference in level and color shade tend to occur.

SUMMARY OF THE INVENTION

The present invention provides a process for preparing a color filter, which does not have the above mentioned problems. The process of the present invention comprises:

(a) forming a transparent electroconductive layer on a substrate, (b) forming a negative type photosensitive resin layer having a desired color by electrodeposition on the transparent electroconductive layer, (c) exposing the photosensitive resin layer to light through a negative mask having a desired pattern followed by developing to form a patterned color layer, and (e) effecting the steps (b) and (c) necessary times to form patterned layers having required colors.

DETAILED DESCRIPTION OF THE INVENTION

Figure 1A:
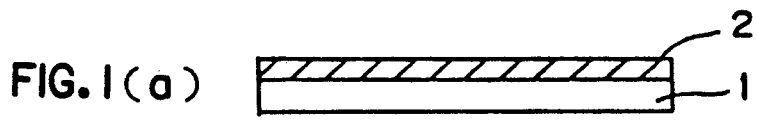
FIG. 1 is a process drawing which shows the process of the present invention.
Figure 1B:
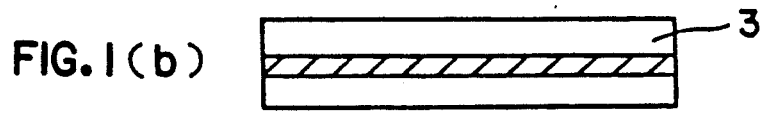
Figure 1C:
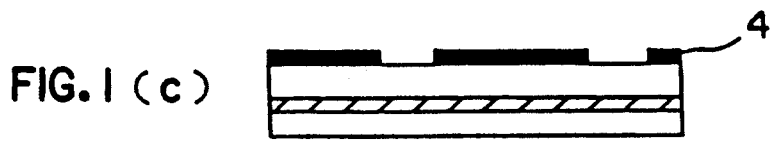
Figure 1D:
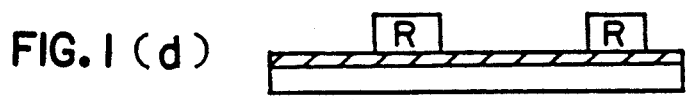
Figure 1E:
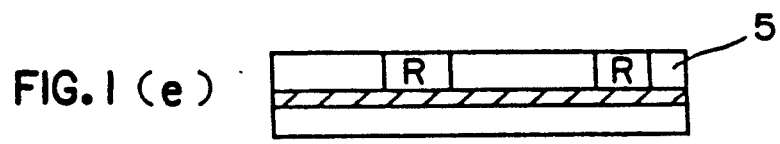
Figure 1F:
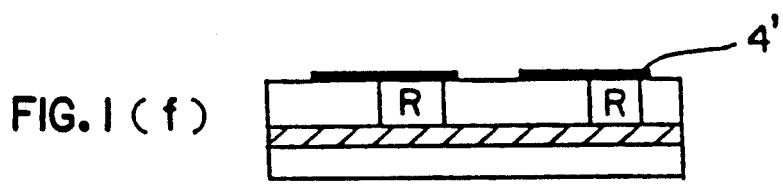
Figure 1G:
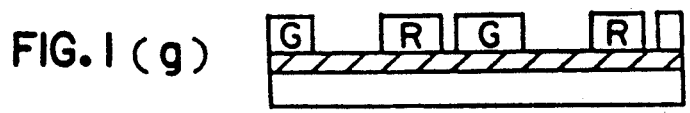
Figure 1H:
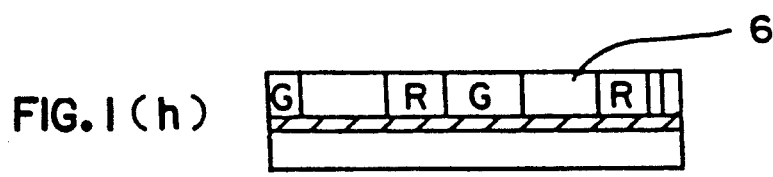
Figure 1I:
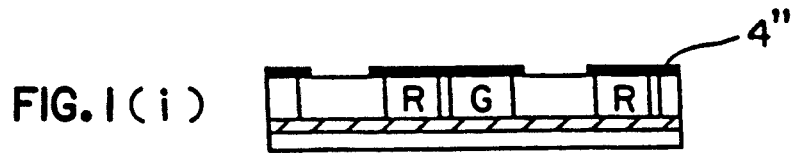
Figure 1J:
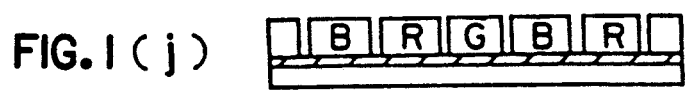

Firstly, as shown in FIG. 1 (a), a transparent electroconductive layer 2 is formed on a substrate 1. The substrate 1 can be any one which is known to the art in this field, preferably glass or plastic. The transparent electroconductive layer can be prepared from tin oxide, indium oxide, antimony oxide and the like.

Then, as shown in FIG. 1 (b), a negative type photosensitive resin layer 3 is formed on the transparent electroconductive layer 2 by electrodeposition. The photosensitive resin layer may be colored with red, green, blue or black. In this context, the color layer is formed in the order of red, green and blue, but this is not limited. In the present invention, the negative photosensitive layer 3 is formed by electrodepositing in an electrodeposition bath with passing electric current through the electroconductive layer 2. The electrodeposition bath generally contain (i) a negative type photosensitive resin as a film-forming component which becomes water depositable by neutralizing with acid or alkali, (ii) a dyestuff which gives color to the electrodeposited film, (iii) an organic solvent which controls electrodeposition properties and bath stability, (iv) an alkaline or acidic material which makes the photosensitive resin electrodepositable, (v) a photopolymerization initiator and if necessary (vi) a photosensitizer or some additives for controlling surface smoothness, electrodeposition properties and bath stability. The negative type electrodepositable photosensitive resin composition is disclosed in Japanese Kokai Publications 61-247090 and 62-262856 (corresponding to U.S. Pat. Nos. 4,671,854 and 4,845,012), which are incorporated hereto.

FIG. 1 (c) shows that a negative mask 4 having a desired pattern is contacted on the photosensitive resin layer 3. The contact may be conducted in a vacuum condition. The photosensitive resin layer 3 is exposed to light through the negative mask and then developed with a developer to elute out the non-exposed portion (see FIG. 1 (d), thus obtaining a red patterned filter. Exposing and developing techniques are known to the art. For example, the light source for the exposure is not limited, but preferably has a wave length between 300 to 450 nm. Examples of the light sources are sun light, a mercury lamp, a xenone lamp, an arc lamp and the like. The curing of the photosensitive resin layer by the irradiation of light is generally conducted for one second to several minutes, preferably within the range of one second to 20 seconds. If the electrodeposition is anionic, the developing can be conducted by spraying a weak alkali solution to the non-exposed portion. Examples of the alkali solution are sodium hydroxide, sodium carbonate, potassium hydroxide, ammonia, sodium metasilicate and the like. If sodium hydroxide is employed, the alkali solution contains it in an amount of 0.1 to 5% by weight. If the electrodeposition is cationic, a weak acidic solution is employed as a developer. The weak acidic solution contains an acidic material in an amount of 0.1 to 5.0% by weight. Examples of the acidic materials are acetic acid, lactic acid, crotinic acid, itaconic acid and the like.

Next, a green photosensitive resin layer 5 is formed by electrodeposition as mentioned above (see FIG. 1 (e)). The red patterned filter acts as an insulating layer and the green layer 5 is not formed thereon. A negative mask 4' having a desired pattern is contacted with the surface of the resin layer and 5 and the red patterned filter, as shown in FIG. 1 (f), and then exposed and developed to form a green patterned filter between the red patterned filter (see FIG. 1 (g)).

The third color (blue) filter is also formed by an electrodeposition (FIG. 1 (h)), an exposure through a negative mask 4" (FIG. 1 (i)) and a development to form a three color (red, green and blue) color filter (FIG. 1 (j)).

The color filter is generally formed from the three color (red, green and blue) filter, but in a case where 4 colors or more (including black stripe) are desired the above steps can be effected again. Also, the black stripe may be formed between the color filter by a art-known coloring method.

According to the process of the present invention, once a transparent electroconductive layer is formed, it can be used as an electrode for all colors, thus simplifying the steps. The color filter is formed by electrodeposition and therefore uniformity of film thickness is kept throughout the substrate. The color layer which has been formed on the substrate functions as insulating layer and therefore it never happens that one color layer is piled on another color layer. The conventional spin-coating method consumes an expensive photosensitive resin composition, but the method of the present invention does not consume it, which reduces costs.

In the process of the present invention, the color filter is formed on the same transparent electroconductive electrode, and therefore is very suitable for an active matrix type liquid crystal color display.

EXAMPLES

The present invention is illustrated by the following Examples which, however, are not to be construed as being limited to their details.

PREPARATION 1

Preparation of an Anionic Negative Type Photosensitive Resin Composition

A reaction vessel was charged with 90 parts by weight of ethyleneglycol monobutyl ether and heated to 90° C. To the content, a mixture of 30 parts by weight of methacrylic acid, 20 parts by weight of styrene, 50 parts by weight of ethyl acrylate and 2 parts by weight of azobisisobutylonitrile was added dropwise over 3 hours in a nitrogen atmosphere. After finishing the addition, it was aged for 30 minutes, to which a mixture of one part by weight of azobisisobutylonitrile and 10 parts by weight of ethyleneglycol monobutyl ether was added dropwise over 30 minutes. It was then aged for 3 hours to obtain an acryl resin solution having an acid value of 99. Next, 3 parts by weight of 2,2-dimethoxy-2-phenylacetophenone and 15 parts by weight of trimethylolpropane were added and then neutralized with 0.6 equivalent of monoethanol amine. It was diluted with deionized water to obtain an electrodeposition bath having a non-volatile content of 10%.

PREPARATION 2

Preparation of an Anionic Negative Type Photosensitive Resin Composition

A reaction vessel was charged with 90 parts by weight of ethyleneglycol monobutyl ether and heated to 90° C. To the content, a mixture of 40 parts by weight of methyl methacrylate, 40 parts by weight of butyl acrylate, 20 parts by weight of acrylic acid, and 2 parts by weight of azobisisobutylonitrile was added dropwise over 3 hours in a nitrogen atmosphere. After finishing the addition, it was aged for 30 minutes, to which a mixture of one part by weight of azobisisobutylonitrile and 10 parts by weight of ethyleneglycol monobutyl ether was added dropwise over 30 minutes. It was then aged for 5 hours to obtain an acryl resin solution having an acid value of 155. Next, 24 parts by weight of glycidyl methacrylate, 0.12 parts by weight of hydroquinone and 0.6 parts by weight of tetraethyl ammonium were added and the reaction was conducted at 90° C. for 5 hours with air-blowing to obtain a photosensitive resin composition having an acid value of 50. The solution was neutralized with 0.6 equivalent of monoethanol amine and 3 parts by weight of 2,2-dimethoxy-2-phenyl acetophenone. It was diluted with deionized water to obtain an electrodeposition bath having a non-volatile content of 10%.

PREPARATION 3

Preparation of a Cationic Negative Type Photosensitive Resin Composition

A reaction vessel was charged with 90 parts by weight of ethyleneglycol monobutyl ether and heated to 90° C. To the content, a mixture of 30 parts by weight of N,N-diethylaminoethyl methacrylate, 20 parts by weight of styrene, 50 parts by weight of ethyl acrylate and 2 parts by weight of azobisisobutylonitrile was added dropwise over 3 hours in a nitrogen atmosphere. After finishing the addition, it was aged for 30 minutes, to which a mixture of one part by weight of azobisisobutylonitrile and 10 parts by weight of ethyleneglycol monobutyl ether was added dropwise over 30 minutes. It was then aged for 3 hours to obtain an acryl resin solution having an acid value of 99. Next, 3 parts by weight of 2,2-dimethoxy-2-nonylacetophenone and 20 parts by weight of trimethylolpropane were added and then neutralized with 0.5 equivalent of acetic acid. It was diluted with deionized water to obtain an electrodeposition bath having a non-volatile content of 10%.

The obtained electrodepositable resin composition was mixed with a pigment in the following formulation to obtain three color negative type electrodeposition bath.

|  | Red | Green | Blue |
|---|---|---|---|
| Negative type photosensitive electrodepositable resin composition (anionic = Preparation 1 or 2) (cationic = Preparation 3) | 970.0 | 965.0 | 970.0 |
| Azo metal salt red pigment | 30.0 | | |
| Phthalocyanine Blue | | 35.0 | |
| Phthalocyanine Green | | | 30.0 |
|  | 1000.0 | 1000.0 | 1000.0 |

EXAMPLE 1

An ITO (indium tin oxide) transparent electroconductive layer 2 was formed on a substrate 1. The electroconductive layer 2 was connected to a positive electrode and a metal bath for the electrodepositable composition was connected with a minus electrode. The substrate was immersed in the electrodeposition bath and a direct current of 100 volt was applied between electrodes for one minute to deposit a red negative type photosensitive resin layer of Preparation 1 with a thickness of about 2 microns on the electroconductive layer 2. It was rinsed with water and dried to form a red negative type photosensitive resin layer 3.

Then, a negative mask 4 having a desired pattern was placed on the resin layer 3 and exposed to a high pressure mercury lamp to cure the exposed portion. The substrate was spray-developed with a 0.5 wt % sodium hydroxide solution at 50° C. for 60 seconds and the non-exposed portion was eluted to form a patterned red filter.

The substrate was then immersed in a green electrodeposition bath and electrodeposited as generally described above to form a green photosensitive resin layer between the patterned red filter. It was exposed and developed as mentioned above to obtain a patterned green film. The same process was conducted to form a red, green and blue patterned resin layer on the substrate.

EXAMPLE 2

A color filter was prepared as generally described in Example 1, with the exception that the cationic negative type photosensitive resin composition of Preparation 3 was employed instead of the anionic negative type photosensitive resin composition of Preparation 1, and the electrodes were reversely connected.

What is claimed is:

1. A process for preparing a color filter comprising:
   (a) forming a transparent electroconductive layer on a substrate,
   (b) forming a negative type photosensitive resin layer having a desired color by electrodeposition directly on the transparent electroconductive layer,
   (c) exposing the photosensitive resin layer to light through a negative mask having a desired pattern followed by developing to form a patterned color layer, and
   (e) effecting the steps (b) and (c) necessary times to form patterned layers having required colors.

2. The process according to claim 1 wherein said substrate is glass or plastic.

3. The process according to claim 1 wherein said transparent electroconductive layer is indium tin oxide.

4. The process according to claim 1 wherein said negative photosensitive layer is formed by electrodepositing in an electrodeposition bath with passing electric current through the electroconductive layer.

5. The process according to claim 4 wherein said electrodeposition bath contains (i) a negative type photosensitive resin as a film-forming component which becomes water depositable by neutralizing with acid or alkali, (ii) a dyestuff which gives color to the electrodeposited film, (iii) an organic solvent which controls electrodeposition properties and bath stability, (iv) an alkaline or acidic material which makes the photosensitive resin electrodepositable and (v) a photopolymerization initiator.

* * * * *